United States Patent [19]

Teranishi et al.

[11] 4,084,105
[45] Apr. 11, 1978

[54] LSI LAYOUT AND METHOD FOR FABRICATION OF THE SAME

[75] Inventors: Yuichi Teranishi, Hinodemachi; Masayoshi Abe, Kokubunji, both of Japan

[73] Assignee: Hitachi, Ltd., Japan

[21] Appl. No.: 685,529

[22] Filed: May 11, 1976

[30] Foreign Application Priority Data

May 28, 1975 Japan .............................. 50-62858

[51] Int. Cl.² ...................... H03K 19/08; H03K 19/20
[52] U.S. Cl. .................................. 307/205; 29/577 C; 307/207; 307/213; 307/215; 307/241; 307/242; 365/104
[58] Field of Search ............... 307/203, 205, 207, 215, 307/218, 213, 241, 243, 251; 29/577; 340/173 SP

[56] References Cited

U.S. PATENT DOCUMENTS

| | | | |
|---|---|---|---|
| 3,678,476 | 7/1972 | Ebertin | 307/205 X |
| 3,731,073 | 5/1973 | Moylan | 307/207 X |
| 3,775,693 | 11/1973 | Proebsting | 307/215 X |
| 3,892,596 | 7/1975 | Bjorklund | 29/577 X |
| 3,914,855 | 10/1974 | Cheney et al. | 29/577 X |
| 3,981,070 | 9/1976 | Buelow et al. | 29/577 X |
| 3,983,619 | 10/1976 | Kubo et al. | 29/577 X |
| 3,988,214 | 10/1976 | Tsunemitsu | 29/577 X |
| 3,990,045 | 11/1976 | Beausoleil et al. | 307/207 X |

Primary Examiner—Larry N. Anagnos

Attorney, Agent, or Firm—Craig & Antonelli

[57] ABSTRACT

An LSI layout includes a logic function section and a series connection array of two MOSFETs, one end of which array is coupled to a power source voltage and the other end of which array is coupled to ground potential. A fixed logic output is produced at a junction point of the two MOSFETs by providing one MOSFET as an enhance-type MOSFET and providing the other MOSFET as a depletion type MOSFET. A logic circuit is provided which is connected with the junction point of the MOSFET array and with the logic section and is operable to couple the output of the logic section to an output side thereof. Two logic sections may be respectively associated with two logic circuits one of which is operable to couple the output of one logic section to an output thereof for its practical use and the other of which is operable not to couple the output of the other logic section to an output side thereof. The selection of the used section and the unused section is determined by the selection of either one of MOSFETs to depletion type. The LSI layout further may include a circuit section including MOSFETs. In that case, a single mask may be used in introducing a selected MOSFET of the MOSFET array and selected MOSFETs of the circuit section as depletion types. Such an LSI layout is suitable for the manufacture of many different kinds of LSI layouts with a minimized number of fabrication masks.

10 Claims, 9 Drawing Figures

FIG. 4    FIG. 5A    FIG. 5B
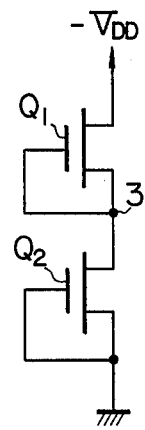
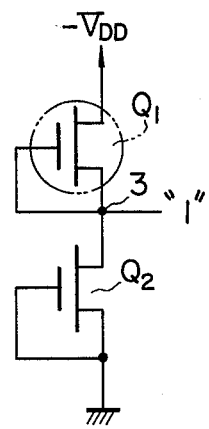
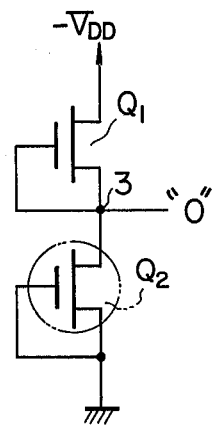
FIG. 6
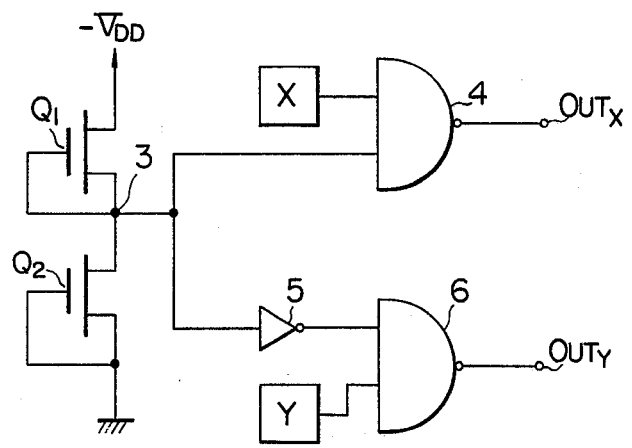

LSI LAYOUT AND METHOD FOR FABRICATION OF THE SAME

BACKGROUND OF THE INVENTION

1. Field of the Invention

The present invention relates a Large Scale Integrated (hereinafter referred to as LSI) layout and a method for fabrication of the same.

2. Description of the Prior Art

In the fabrication of semiconductor integrated circuits, it is necessary to use a plurality of fabrication masks such as a diffusion pattern forming mask and an interconnection pattern forming mask. Usually, these masks are changed depending upon the kind or type of semiconductor integrated circuits and the production of masks are troublesome. In general, therefore, it is not preferable to manufacture many different kinds of semiconductor integrated circuits in small amounts for the respective kinds of circuits.

However, a request for the manufacture of various semiconductor integrated circuits, whose kinds or types are different depending upon user's requirements and whose amounts of production are relatively small, is customary. Therefore, "master slice" methods have been proposed. In a typical master slice method, the same mask is used at least until the diffusion step for every kind of semiconductor circuits but different interconnection patterns are employed for the respective kinds. Namely, only the interconnection pattern forming mask is changed.

A problem arises in to the case where the master slice method is applied to the change of an LSI layout to a different kind, which layout includes insulated gate metal-oxide-semiconductor transistors of enhancement type and insulated gate metal-oxide-semiconductor transistors (hereinafter referred to as MOSFET) of the depletion type. For a circuit section such as a read only memory (ROM), its logic or circuit function is changed depending upon which MOSFETs arranged usually in a matrix form should be provided as depletion type MOSFETs. On the other hand, for a logic function section other than a ROM, its logic function is changed by the change of an interconnection pattern forming mask. When the simultaneous change of both the logic functions is desired, both of the depletion type MOSFET forming mask and the interconnection pattern forming mask must be changed.

SUMMARY OF THE INVENTION

An object of the present invention is to provide an LSI layout and a method for fabrication of the same, in which different kinds of LSI layouts can be manufactured with a minimized number of fabrication masks.

The present invention is characterized in that an LSI layout additionally includes a series connection array of two MOSFETs one end of which array is coupled to a power source voltage and the other end of which array is coupled to ground potential and that a fixed logic output is produced at a junction point of the two MOSFETs of the MOSFET array by providing one of the two MOSFETs as an enhancement type MOSFET and providing the other MOSFET as a depletion type MOSFET.

In one embodiment of an LSI layout according to the present invention, the LSI layout includes, in a semiconductor substrate, a logic function section, the above-described series connection array of two MOSFETs, and logic means connected with the output of the MOSFET array and with the output of the logic function section and operable to couple the logic output of the logic function section to an output side thereof. In the case where the LSI layout of this embodiment is utilized and the provision of a logic function section as practically used and a logic function section as not practically used is necessary in a semiconductor substrate for the manufacture of different kinds of function systems, the selection of the used section and the unused section is made by the selection of either one MOSFET of each of the MOSFET arrays associated with the respective sections as a depletion type, instead of the change of an interconnection pattern forming mask. This is advantageous in that when the LSI layout further includes a circuit section such as a ROM having MOSFETs a single mask may be used in introducing selected MOSFETs of the circuit section and a selected MOSFET of the MOSFET array as depletion types while the change of an interconnection pattern forming mask is not required.

In another embodiment of an LSI layout according to the present invention, the LSI layout includes, in a semiconductor substrate, two logic function sections, the above-described series connection array of two MOSFETs associated with the two logic function sections, logic means connected with the output of one of the two logic function sections and with the output of the MOSFET array and operable to couple the logic output of the one logic function section to an output side thereof, and logic means connected with the output of the other logic function section and with the output of the MOSFET array and operable not to couple the logic output of the other logic function section. As a result, the one logic function section is practically used and the other logic function section is not practically used. The selection of the used section and the unused section is made by the selection of either one MOSFET of the MOSFET array to a depletion type. The reason for the provision of used logic function section and unused logic function section is that a logic function section unused in a certain kind of LSI layout may be subjected to its practical use in another kind of layout and/or that when a plurality of similar logic function section sets each having first and second logic function sections are provided in the same semiconductor substrate the first (or second) logic function section may be subjected to its practical use in a certain set but may be not subjected to its practical use in another set. The LSI layout is advantageous in that when the LSI layout further includes a circuit section such as a ROM having MOSFETs, a single mask may be used in introducing selected MOSFETs of the circuit section and a selected MOSFET of the MOSFET array as depletion types while the change of an interconnection pattern forming mask is not required.

BRIEF DESCRIPTION OF THE DRAWINGS

FIG. 4 shows a basic pattern of a series connection array of two MOSFETs which is used in the present invention.

FIGS. 5A and 5B show examples of the operation of the basic pattern shown in FIG. 4.

FIG. 6 shows an example of the connection of a logic function section with the basic pattern shown in FIG. 4.

DESCRIPTION OF THE PREFERRED EMBODIMENTS

Prior to presenting a description of preferred embodiments of the present invention, a description will be now made of a conventional master slice method and a conventional example in which a master slice method is utilized for the fabrication of an LSI layout.

Figure 1:
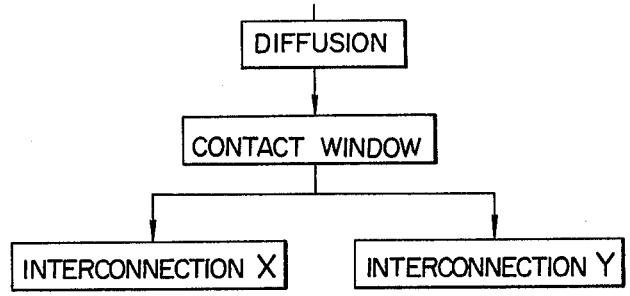
FIG. 1 shows a flow chart of a semiconductor integrated circuit fabrication process according to a typical prior art master slice method.

FIG. 1 illustrates a typical example of a conventional master slice method which is used for the fabrication of semiconductor integrated circuits. The figure shows that when it is desired to manufacture semiconductor integrated circuits of the X kind and of the Y kind, a diffusion pattern and a contact window forming mask are fixed or commonly used whereas an interconnection pattern or hence an interconnection pattern forming mask is changed depending upon the kind of semiconductor integrated circuits to be manufactured. Semiconductor substrates to which diffusion and contact window patterns have been applied are called master slices.

Figure 2:
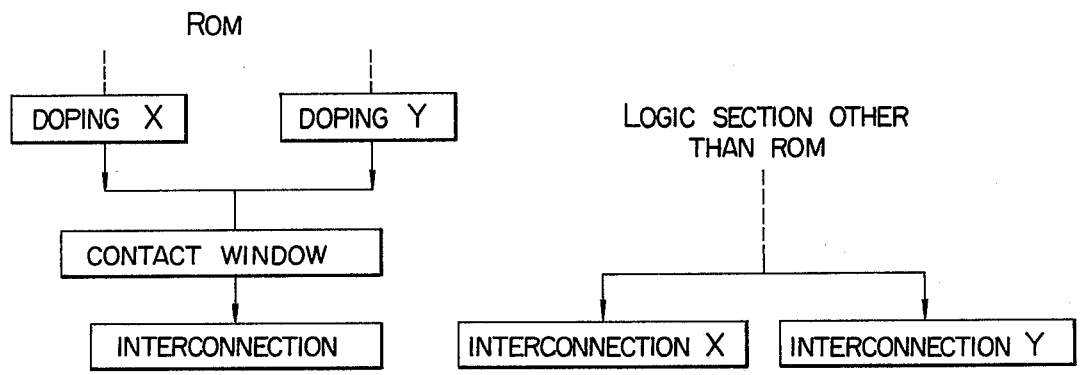
FIG. 2 shows a flow chart of a fabrication process of a prior art example in which a master slice method is utilized for the fabrication of an LSI layout including a circuit section such as a ROM and a logic function section other than a ROM.

In some applications of semiconductor integrated circuits, it is sometimes desired to provide an LSI layout including a circuit section such as a ROM and a logic function section other than a ROM. FIG. 2 shows the process flow of a conventional example in which a master slice method is utilized for the fabrication of such LSI layouts. A ROM usually includes MOSFETs arranged in a matrix form. To provide a desired logic or circuit function, selected MOSFETs are formed as depletion types (hereinafter referred to as D-type MOSFETs) and the remaining MOSFETs are formed as enhancement types (hereinafter referred to as E-type MOSFETs). The D-type MOSFET may be formed by doping a channel portion of the MOSFET with an impurity through diffusion or ion implantation. As is apparent from FIG. 2, a doping mask or D-type MOSFET forming mask is changed between ROMs of the X kind and ROMs of the Y kind whereas an interconnection pattern forming mask is changed between logic function sections of the X kind and logic function sections of the Y kind other than a ROM. Therefore, when the simultaneous change of both the kind of ROM and the kind of logic function section other than a ROM is carried out, both a D-type MOSFET forming mask and an interconnection pattern forming mask must be changed. These are not economical if the complexity of the process as well as the production or cost of the mask are considered.

In accordance with the present invention, the above-described drawbacks are eliminated by additionally forming a series connection array of two MOSFETs in a semiconductor substrate. One end of the MOSFET array is coupled to a power source voltage while the other end of the MOSFET array is coupled to ground potential. A fixed logic output is produced at a junction point of the two MOSFETs by providing one MOSFET of the MOSFET array as an E-type MOSFET and the other MOSFET as a D-type MOSFET.

Figure 3:
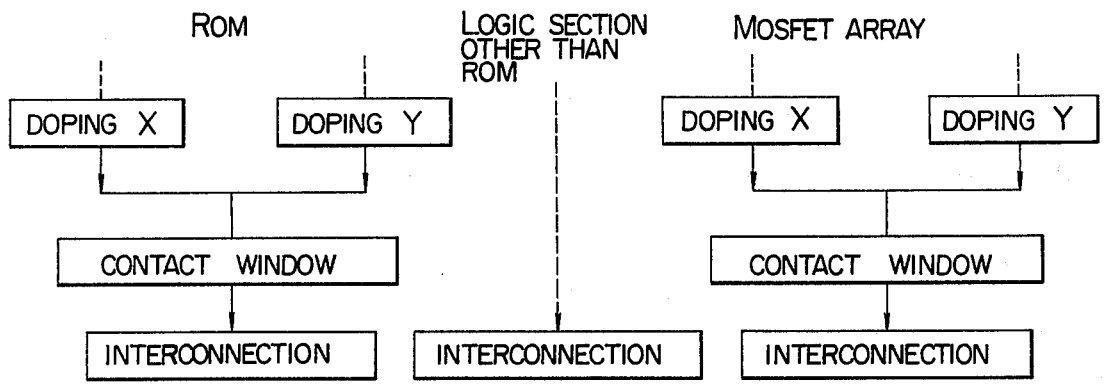
FIG. 3 shows a flow chart of a fabrication process of an example in which the principle of the present invention is applied to the fabrication of an LSI layout including a circuit section such as a ROM and a logic function section other than a ROM.

FIG. 3 shows the process flow of an example in which the principle of the present invention is applied to the fabrication of an LSI layout including a circuit section such as a ROM and logic function section other than a ROM in a semiconductor substrate. In accordance with the present invention, when an LSI layout is changed from the X kind to the Y kind, an interconnection pattern or an interconnection pattern forming mask for a logic function section other than a ROM is not changed between the layout of the X kind and the layout of the Y kind. Thereinstead, a MOSFET array of two MOSFETs as described above is associated with the logic function section other than a ROM in such a manner that the logic function section is subjected to its practical use in the semiconductor substrate by the selection of either one MOSFET of the MOSFET array to a D-type MOSFET. In other words, the determination of a selected one of the two MOSFETs as a D-type MOSFET provides an effect equivalent to the change of an interconnection pattern for logic function section other than a ROM. As is apparent from FIG. 3, the same doping mask or D-type MOSFET forming mask can be used in introducing a selected MOSFET of the MOSFET array and selected MOSFETs of the ROM as D-type MOSFETs.

FIG. 4 shows a basic pattern of series connection array of two MOSFETs which is used in the present invention. As shown in the figure, two MOSFETs $Q_1$ and $Q_2$ are connected in series with each other. A drain of the MOSFET $Q_1$ is coupled to a power source voltage ($-V_{DD}$) and a source of the MOSFET $Q_2$ is coupled to a ground potential. Gates of the MOSFETs $Q_1$ and $Q_2$ are connected with their respective sources so that the gate of the MOSFET $Q_1$ has the same potential as a junction point 3 and the gate of the MOSFET $Q_2$ has a ground potential. A logic output "1" or "0" is produced at the junction point 3 by providing the MOSFET $Q_1$ or $Q_2$ as a D-type MOSFET. MOSFETs $Q_1$ and $Q_2$ are first formed as E-type MOSFETs and a selected one of the MOSFETs $Q_1$ and $Q_2$ is thereafter changed to a D-type MOSFET by doping a channel portion of the selected MOSFET with an impurity such as boron through diffusion or ion implantation, as is well known. FIG. 5A shows that the MOSFET $Q_1$ is provided as a D-type MOSFET and the junction point 3 produces an output of logic "1" ($-V_{DD}$ level). FIG. 5B shows that the MOSFET $Q_2$ is provided as a D-type and the junction point 3 produces an output of logic "0" (ground level).

The above-described basic pattern of a series connection array of two MOSFETs can be utilized with a connection scheme as shown in FIG. 6, when a change is desired between a logic function section of the X kind and a logic function section of the Y kind. In the case where the junction 3 of the MOSFETs $Q_1$ and $Q_2$ produces a logic "1" output, the logic function section X is subjected to its practical use through a NAND gate 4. On the other hand, in the case where the junction point 3 produces a logic "0" output, the logic function section Y is subjected to its practical use through an inverter 5 and a NAND gate 6. In FIG. 6, the NAND gate 4 or the combination of inverter 5 and NAND gate 6 functions to couple the logic output of the logic function section X or Y to an output side $OUT_X$ or $OUT_Y$ thereof in connection with the logic output at the junction point 3 of the MOSFETs $Q_1$ and $Q_2$. Of course, any suitable logic means having such a function may be employed.

Figure 7:
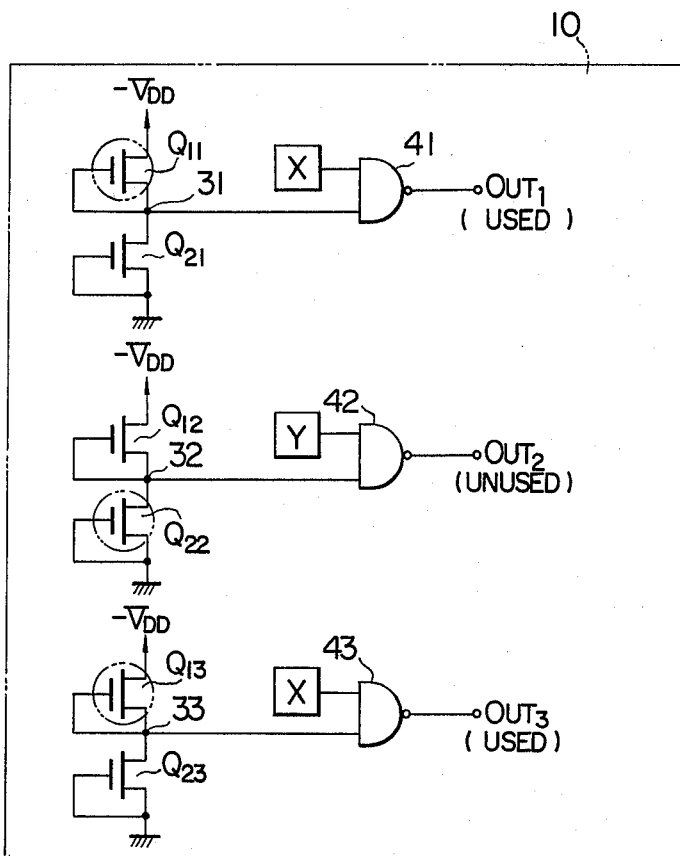
FIGS. 7 and 8 show examples of an LSI layout including logic function sections as practically used and logic function sections as practically unused, in which the connection scheme of FIG. 6 is utilized.
Figure 8:
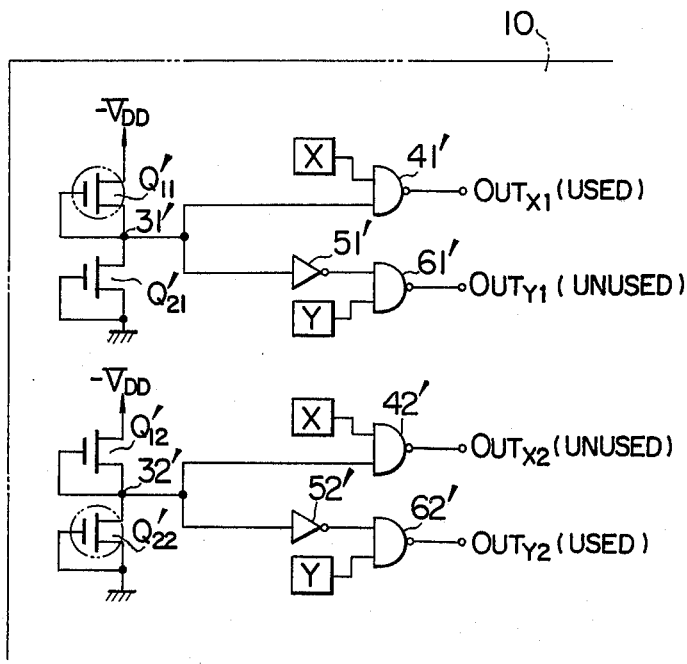

FIGS. 7 and 8 show examples of an LSI layout including, in a semiconductor substrate 10, logic function sections as practically used and logic function sections as practically unused, in which the connection scheme of FIG. 6 is utilized. The provision of both the used and unused sections in a semiconductor substrate is necessary for the manufacture of many different kinds of LSI layouts.

The case where a series connection array of two MOSFETs is associated with one logic function section is shown in FIG. 7. In a first row, a MOSFET $Q_{11}$ is provided as a D-type MOSFET to produce a logic "1" output at a junction point 31 so that the logic output of a logic function section X is coupled through a NAND gate 41 to its output side $OUT_1$ (section X used). In a second row, a MOSFET $Q_{22}$ is provided as a D-type MOSFET to produce a logic "0" output at a junction point 32 so that the output of a logic function section Y (or X) is not coupled to an output side $OUT_2$ of a NAND gate 42 (section Y unused). In a third row, a logic function section X is subjected to its practical use in a similar manner to the first row. When another kind of LSI layout is fabricated, the selection of either one of two MOSFETs in each row as a D-type MOSFET determines whether a logic function section in each row should be practically used or not.

The case where a series connection array of two MOSFETs is associated with two different logic function sections is shown in FIG. 8. In a first row, a MOSFET $Q_{11}'$ is provided as a D-type MOSFET so that a function section X is subjected to its practical use and a function section Y is not subjected to its practical use. In a second row, a MOSFET $Q_{22}'$ is provided as a D-type MOSFET so that a function section X is not subjected to its practical use and a function section Y is subjected to its practical use.

A logic function section in the present invention may include various circuit elements such as transistors, diodes, resistors and capacitors.

In the fabrication of an LSI layout according to the present invention, a logic function section including circuit elements and capable of providing a predetermined logic function, a MOSFET array of two MOSFETs (E-type MOSFETs) and logic means for associating the logic function section with the MOSFET array are first formed in a semiconductor substrate. Specifically, as a first step, in a semiconductor substrate, such as substrate 10, schematically illustrated in FIGS. 7 and 8, a logic function 7, such as sections X or Y, which includes circuit elements capable of performing a predetermined logic function, is formed. Also, a MOSFET array including first and second MOSFETs, such as MOSFETs $Q_{11}$ and $Q_{21}$, of the enhancement type, are formed. Also, logic means, such as the NAND gate including first and second inputs to be associated respectively with the logic function section and with the MOSFET array to couple an output of the logic function section to an output side thereof is formed.

As a next step, a channel portion of a selected one of the first and second MOSFETs, such as the MOSFET $Q_{11}$, of the array, is doped with an impurity, to convert the selected MOSFET to a depletion type MOSFET, as discussed above previously in connection with the description of FIGS. 4, 5A and 5B.

As a third step, there is formed a first connection pattern including a connection portion for connecting a drain of the first MOSFET of the array with the power source voltage. This is schematically shown in FIG. 7, for example, wherein the drain of MOSFET $Q_{11}$ is connected to the power source voltage $-V_{DD}$. A connection portion is also formed for connecting a gate of this first MOSFET with its source. This is also schematically shown in FIG. 7, wherein the source and gate of MOSFET $Q_{11}$ are connected to each other. A connection portion for connecting the source of the first MOSFET (such as MOSFET $Q_{11}$) and the drain of the second MOSFET (such as MOSFET $Q_{21}$) is formed. This is also shown in FIG. 7 by the schematic connection between the source of MOSFET $Q_{11}$ and the drain of MOSFET $Q_{21}$. Also formed is a connection portion for connecting the gate of the second MOSFET, such as MOSFET $Q_{21}$, with its source, and a connection portion for connecting the source of the second MOSFET with ground potential. This connection is also again schematically illustrated in FIG. 7, for example.

A second connection pattern is also formed, which connection pattern includes connection portions for interconnecting the circuit elements in the logic function section to provide a predetermined logic function. For the purposes of illustrating the logic function section, these specific connection portions, which may be readily designed by one skilled in the art depending upon the logic function intended, have not been shown in detail, but rather each of the logic function sections has been illustrated in the manner of a block, such as the block X or the block Y.

A third logic connection pattern is formed to include a connection portion for connecting the first input of the logic means with a junction point between the source of the first and second MOSFETs of the array. This is schematically illustrated in FIG. 7, for example, by the connecting line between junction point 31 and one input of NAND gate 41. There is also formed a connection portion for connecting the second input of the logic means with the output of the logic function section, this again being shown by a connecting line between a logic function section X and an input to the NAND gate 41.

In addition to the above-described technique for fabricating an LSI layout wherein a single logic function is connected to one input of a logic means, multiple logic functions may be coupled to multiple logic means, as illustrated in FIG. 8, wherein logic functions X and Y are connected as respective inputs to NAND gates 41' and 61' of FIG. 8. The first logic function section is subjected to its practical use while the second logic function section is not subjected to its practical use. Separate configurations for used and unused logic functions are shown in FIGS. 7 and 8 of the drawings and the pattern connections between the various elements are schematically illustrated, as pointed out previously. In the technique for forming multiple logic function and multiple logic means, for fabricating the LSI layout, there may be included a first step of forming a first logic function section, including circuit elements capable of providing a first predetermined logic function, a second logic function section including circuit elements capable of providing a second predetermined logic function, a MOSFET array of first and second MOSFETs of the enhancement type, first logic means including first and second inputs to be associated, respectively, with the first logic function section and with the MOSFET array to couple the output of the first logic function section to an output side thereof, and second logic means including first and second inputs to be associated respectively with the second logic function section and with the MOSFET array not to couple an output of the second logic function section to an output side thereof.

The process may further include a second step of doping a channel portion of a selected one of the MOSFETs with an impurity to convert the selected MOSFET to a depletion type MOSFET. As a third step, there may be formed a first connection pattern including a connection portion for connecting a drain of the first MOSFET of the array with a power source voltage, a connection portion for connecting a gate of the first MOSFET with a source thereof, a connection portion for connecting the source of the first MOSFET with a drain of the second MOSFET, a connection portion for connecting a gate of the second MOSFET with its source, and a connection portion for connecting the source with ground. The process also includes the formation of a second connection pattern, including connection portions for interconnecting the circuit elements in the first logic function section to provide the first predetermined logic function. A third connection pattern may be formed to include connection portions for interconnecting the circuit elements in the second logic function section to provide the second predetermined logic function while a fourth connection pattern may be formed to include a connection pattern portion for connecting the first input of the first logic means with a junction point between the source of the first MOSFET and the drain of the second MOSFET of the array and a connection portion for connecting the second input of the first logic means with the output of the first logic function section. There may be additionally formed a fifth connection pattern which includes a connection portion for connecting the first input of the second logic means with the junction point of the MOSFET array and a connection portion for connecting the second input of the second logic means with the output of the second logic function section. Again, as was the case with the initial process described above, reference may be had to FIGS. 7 and 8 of the drawings of the present application for a schematic illustration of various connection portions between the logic elements, such as the NAND gates, the logic function sections, such as sections X and Y, and the MOSFET arrays interconnected as described above. Then, a channel portion of a selected MOSFET of the MOSFET array is doped with an impurity to introduce the selected MOSFET as a D-type MOSFET. The doping may be carried out by diffusion or ion implantation in a well known manner. Therefore, a connection pattern including the interconnection between circuit elements in the logic function section, the interconnection in the MOSFET array as shown in FIG. 4 and the connection of the logic means with the logic function section and with the MOSFET array as shown in FIG. 6, 7 or 8 is effected by a connection pattern forming mask.

In the case where the LSI layout includes a circuit section such as having MOSFETs to introduce selected MOSFETs of the circuit section as D-type MOSFETs for providing a desired circuit function may be carried out by use of a doping mask or a D-type MOSFET forming mask which is used in introducing a selected MOSFET of the MOSFET array as a D-type MOSFET. The above-described connection pattern may include the interconnection between MOSFETs in the circuit section.

We claim:

1. As LSI layout including, in a semiconductor substrate:
    (a) a logic function section having a predetermined logic function;
    (b) a MOSFET array having first and second MOSFETs, a drain of the first MOSFET being coupled to a power source voltage, a gate of the first MOSFET being connected with a source thereof, the source of the first MOSFET being connected with a drain of the second MOSFET, a gate of the second MOSFET being connected with a source thereof, the source of the second MOSFET being coupled to a ground potential, one of the first and second MOSFETs being of an enhancement type and the other MOSFET being of a depletion type to produce a fixed logic output at a junction point between the source of the first MOSFET and the drain of the second MOSFET; and
    (c) logic means connected with the junction point of the MOSFET array at a first input thereof and with the logic function section at a second input thereof and operable to couple a logic output of the logic function section to an output side thereof.

2. An LSI layout according to claim 1, wherein the first MOSFET is of a depletion type so that the fixed logic output at the junction point of the MOSFET array is "1", and the logic means comprises a NAND gate.

3. An LSI layout according to claim 1, wherein the second MOSFET is of a depletion type so that the fixed logic output at the junction point of the MOSFET array is "0", and the logic means comprises a NAND gate with an invertor between the first input of the logic means and the junction point of the MOSFET array.

4. An LSI layout including, in a semiconductor substrate:
    (a) a first logic function section having a first logic function;
    (b) a second logic function section having a second logic function;
    (c) a MOSFET array having first and second MOSFETs a drain of the first MOSFET being coupled to a power source voltage, a gate of the first MOSFET being connected with a source thereof, the source of the first MOSFET being connected with a drain of the second MOSFET, a gate of the second MOSFET being connected with a source thereof, the source of the second MOSFET being coupled to a ground potential, one of the first and second MOSFETs being of an enhancement type and the other MOSFET being of a depletion type to produce a fixed logic output at a junction point between the source of the first MOSFET and the drain of the second MOSFET; and
    (d) first logic means connected with the junction point of the MOSFET array at a first input thereof and with the first logic function section at a second input thereof and operable to couple a logic output of the first logic function section to an output side thereof, whereby the first logic function section is subjected to its practical use; and
    (e) second logic means connected with the junction point of the MOSFET array at a first input thereof and with the second logic function section at a second input thereof and operable to couple a logic output of the second logic function section to an output side thereof, whereby the second logic function section is not subjected to its practical use.

5. An LSI layout according to claim 4, wherein the first MOSFET is of a depletion type so that the fixed logic output at the junction point of the MOSFET array is "1", the first logic means comprises a NAND gate, and the second logic means comprises a NAND gate with an inverter between the first input of the second logic means and the junction point of the MOSFET array.

6. An LSI layout according to claim 4, wherein the second MOSFET is of a depletion type so that the fixed logic output at the junction point of the MOSFET array is "0", the first logic means comprises a NAND gate with an inverter between the first input of the first logic means and the junction point of the MOSFET array, and the second logic means comprises a NAND gate.

7. A method for fabrication of an LSI layout in which in a semiconductor substrate a logic function section is subjected to its practical use, comprising:

a first step of forming, in a semiconductor substrate, (a) a logic function section including circuit elements capable of providing a predetermined logic function, (b) a MOSFET array including first and second MOSFETs of enhancement types, and (c) logic means including first and second inputs to be associated respectively with the logic function section and with the MOSFET array to couple an output of the logic function section to an output side thereof;

a second step of doping a channel portion of a selected one of the first and second MOSFETs of the MOSFET array with an impurity to convert the selected MOSFET to a depletion type MOSFET; and a third step of forming (i) a first connection pattern including a connection portion for connecting a drain of the first MOSFET of the MOSFET array with a power source voltage, a connection portion for connecting a gate of the first MOSFET with a source thereof, a connection portion for connecting the source of the first MOSFET with a drain of the second MOSFET, a connection portion for connecting a gate of the second MOSFET with a source thereof and a connection portion for connecting the source with a ground potential, (ii) a second connection pattern including connection portions for interconnecting the circuit elements in the logic function section to provide the predetermined logic function, and (iii) a third connection pattern including a connection portion for connecting the first input of the logic means with a junction point between the source of the first MOSFET and the drain of the second MOSFET of the MOSFET array and a connection portion for connecting the second input of the logic means with the output of the logic function section, thereby providing an LSI layout in which a fixed logic output is produced at the junction point of the MOSFET array and in which in the semiconduction substrate the logic function section is subjected to its practical use.

8. A method according to claim 7, wherein the first step includes forming a circuit section including MISFETs of the enhancement type capable of providing a predetermined circuit function, the second step includes doping channel portions of selected ones of the MOSFETs of the circuit section to convert the selected MOSFETs to depletion type MOSFETs, and the third step includes forming a fourth connection pattern including connection portions for interconnecting the MOSFETs in the circuit section to provide the predetermined circuit function.

9. A method for fabrication of an LSI layout in which in a semiconductor substrate a first logic function section is subjected to its practical use and a second logic function section is not subjected to its practical use, comprising:

a first step of forming, in a semiconductor substrate, (a) a first logic function section including circuit elements capable of providing a first predetermined logic function, (b) a second logic function section including circuit elements capable of providing a second predetermined logic function, (c) a MOSFET array including first and second MOSFETs of the enhancement type, (d) first logic means including first and second inputs to be associated respectively with the first logic function section and with the MOSFET array to couple an output of the first logic function section to an output side thereof, and (e) second logic means including first and second inputs to be associated respectively with the second logic function section and with the MOSFET array not to couple an output of the second logic function section to an output side thereof;

a second step of doping a channel portion of a selected one of the first and second MOSFETs of the MOSFET array with an impurity to convert the selected MOSFET to a depletion type MOSFET; and a third step of forming (i) a first connection pattern including a connection portion for connecting a drain of the first MOSFET of the MOSFET array with a power source voltage, a connection portion for connecting a gate of the first MOSFET with a source thereof, a connection portion for connecting the source of the first MOSFET with a drain of the second MOSFET, a connection portion for connecting a gate of the second MOSFET with a source thereof and a connection portion for connecting the source with a ground potential, (ii) a second connection pattern including connection portions for interconnecting the circuit elements in the first logic function section to provide the first predetermined logic function, (iii) a third connection pattern including connection portions for interconnecting the circuit elements in the second logic function section to provide the second predetermined logic function, (iv) a fourth connection pattern including a connection portion for connecting the first input of the first logic means with a junction point between the source of the first MOSFET and the drain of the second MOSFET of the MOSFET array and a connection portion for connecting the second input of the first logic means with the output of the first logic function section, and (v) a fifth connection pattern including a connection portion for connecting the first input of the second logic means with the junction point of the MOSFET array and a connection portion for connecting the second input of the second logic means with the output of the second logic function section, thereby providing an LSI layout in which a fixed logic output is produced at the junction point of the MOSFET array and in which in the semiconductor substrate the first logic function section is subjected to its practical use and the second logic function section is not subjected to its practical use.

10. A method according to claim 9, wherein the first step includes forming a circuit section including MOSFETs of the enhancement type capable of providing a predetermined circuit function, the second step includes doping channel portions of selected ones of the MOSFETs of the circuit section to convert the selected MOSFETs to depletion type MOSFETs, and the third step includes forming a sixth connection pattern including connection portions for interconnecting the MOSFETs in the circuit section to provide the predetermined circuit function.

* * * * *